(12) United States Patent
Neumann et al.

(10) Patent No.: US 11,848,276 B2
(45) Date of Patent: Dec. 19, 2023

(54) METHOD OF MANUFACTURING AN ELECTROMAGNETIC INTERFERENCE SHIELDING LAYER

(71) Applicant: HERAEUS DEUTSCHLAND GMBH & CO. KG, Hanau (DE)

(72) Inventors: Christian Neumann, Hanau (DE); Kai-Ulrich Boldt, Hanau (DE); Muriel Thomas, Hanau (DE); Susanne Behl, Hanau (DE); Peter Krämer, Hanau (DE); Holger Ulland, Willich (DE)

(73) Assignee: Heraeus Electronics GmbH & Co. KG, Hanau (DE)

( * ) Notice: Subject to any disclaimer, the term of this patent is extended or adjusted under 35 U.S.C. 154(b) by 407 days.

(21) Appl. No.: 17/287,326

(22) PCT Filed: Nov. 4, 2019

(86) PCT No.: PCT/EP2019/080125
§ 371 (c)(1),
(2) Date: Apr. 21, 2021

(87) PCT Pub. No.: WO2020/094583
PCT Pub. Date: May 14, 2020

(65) Prior Publication Data
US 2021/0358861 A1   Nov. 18, 2021

(30) Foreign Application Priority Data
Nov. 5, 2018   (EP) ..................... 18204384

(51) Int. Cl.
*H01L 23/552* (2006.01)
*C23C 18/14* (2006.01)
(Continued)

(52) U.S. Cl.
CPC ......... *H01L 23/552* (2013.01); *B41M 5/0047* (2013.01); *C09D 11/033* (2013.01);
(Continued)

(58) Field of Classification Search
None
See application file for complete search history.

(56) References Cited

U.S. PATENT DOCUMENTS 9,155,188 B2  10/2015 Merz et al.
9,226,435 B2  12/2015 Fisher, Jr. et al.
(Continued)

FOREIGN PATENT DOCUMENTS

CN    112822931 A  *  5/2021  ............. H01L 23/31
EP       3085811        10/2016
(Continued)

OTHER PUBLICATIONS

Office Action dated Jun. 9, 2023 in TW Application No. 108140154 (with Partial Translation).
(Continued)

*Primary Examiner* — Michael Lebentritt
(74) *Attorney, Agent, or Firm* — Panitch Schwarze Belisario & Nadel LLP

(57) ABSTRACT

A method of manufacturing a semiconductor package which is at least in part covered by an electromagnetic interference shielding layer. The method includes at least these steps: i. providing the semiconductor package and an ink composition having at least a compound comprising at least one metal precursor and at least one organic compound; ii. applying at least a part of the ink composition onto the semiconductor package, wherein a precursor layer is formed; and iii. treating the precursor layer with an irradiation of a peak wavelength in the range from 100 nm to 1 mm. Further disclosed is a semiconductor package comprising an
(Continued)

electromagnetic interference shielding layer comprising at least one metal, wherein the semiconductor package is obtainable by the aforementioned method. Still further disclosed are a semiconductor package comprising an electromagnetic interference shielding layer having a specific conductance and thickness, and uses of an ink composition.

20 Claims, 2 Drawing Sheets

(51) Int. Cl.
| | | |
|---|---|---|
| B41M 5/00 | (2006.01) | |
| C09D 11/033 | (2014.01) | |
| C09D 11/037 | (2014.01) | |
| C09D 11/322 | (2014.01) | |
| C09D 11/36 | (2014.01) | |
| C09D 11/52 | (2014.01) | |
| H01L 21/56 | (2006.01) | |
| H01L 23/31 | (2006.01) | |

(52) U.S. Cl.
CPC .......... *C09D 11/037* (2013.01); *C09D 11/322* (2013.01); *C09D 11/36* (2013.01); *C09D 11/52* (2013.01); *C23C 18/143* (2019.05); *H01L 21/56* (2013.01); *H01L 23/3128* (2013.01)

(56) References Cited

U.S. PATENT DOCUMENTS

| | | |
|---|---|---|
| 9,282,630 B2 | 3/2016 | Merz |
| 9,683,123 B2 | 6/2017 | Cho et al. |
| 2006/0163744 A1* | 7/2006 | Vanheusden ...... H01L 23/49883 257/E21.174 |
| 2008/0036799 A1* | 2/2008 | Ittel ......................... B41J 3/546 347/68 |
| 2008/0206488 A1 | 8/2008 | Chung et al. |
| 2011/0156225 A1 | 6/2011 | Hozoji et al. |
| 2013/0342592 A1 | 12/2013 | Merz |
| 2016/0035677 A1 | 2/2016 | Wachter et al. |

FOREIGN PATENT DOCUMENTS

| | | | |
|---|---|---|---|
| JP | 2006140376 A | * | 6/2006 |
| JP | 2014017349 | | 1/2014 |
| TW | 200427773 A | | 12/2004 |
| TW | 200801799 A | | 1/2008 |
| WO | 2013/128449 | | 9/2013 |

OTHER PUBLICATIONS

Kamyshny et al., "Metal-based Inkjet Inks For Printed Electronics" The Open Applied Physics Journal, 2011, vol. 4, pp. 19-36.

Bei et al. "Research Status and Propects of Particle-Free Silver Conductive Ink" IOP Conf. Series: Materials Science and Engineering 394 (2018), pp. 1-8.

International Search Report and Written Opinion dated Feb. 11, 2020 by the European Patent Office for o unterpart international patent application No. PCT/EP2019/080125.

* cited by examiner

METHOD OF MANUFACTURING AN ELECTROMAGNETIC INTERFERENCE SHIELDING LAYER

RELATED APPLICATIONS

This application is a U.S. national phase application of PCT International Application No. PCT/EP2019/080125 filed on Nov. 4, 2019, which claims the benefit of priority to European Patent Application No. 18204384.4 filed on Nov. 5, 2018, the contents of which are incorporated in this application by reference.

TECHNICAL FIELD

The present invention relates to a method of manufacturing a semiconductor package, which is at least in part covered by a preferably adjoining electromagnetic interference shielding layer, and to a semiconductor package comprising an electromagnetic interference shielding layer comprising at least one metal, wherein the semiconductor package is obtainable by the aforementioned method. The present invention relates also to a semiconductor package comprising an electromagnetic interference shielding layer. The present invention relates further to some uses of an ink composition.

BACKGROUND

The semiconductor industry searches for ongoing improvement of integration density in order to produce smaller electronic components, and smaller electronic devices comprising these electronic components. This search not only focuses on miniaturization of the electronic components, but also on methods to manufacture electromagnetic interference shielding which has a smaller space demand and, in consequence, on improved techniques to manufacture electromagnetic interference shields directly on the electronic component.

A number of procedures are known to equip electronic circuitry with electromagnetic interference shields, such as applying a conductive foil, coating conductive pastes, vacuum deposition of elemental metal in the form of layers and electrochemical methods, and even combinations thereof. Most of these procedures either imply at least one step where a substantial impact of heat, a wet process, vacuum and/or a time-consuming treatment is required to produce a dense and conformal and coherent layer of a shielding material on a semiconductor package. Most of these techniques further require a preceding masking and subsequent de-masking step in order to produce or transfer an electromagnetic interference shield accurately to dedicated areas of the semiconductor package.

In general terms, an object of the present invention is to at least partly overcome at least one of the disadvantages that are known from the prior art.

Another object is to provide a way of producing a tailored electromagnetic interference shielding layer for a semiconductor package.

Another object is to provide a way of producing a conformal electromagnetic interference shielding layer for a semiconductor package.

Another object is to provide a way of applying a partial electromagnetic interference shielding on a semiconductor package, which, e.g., leaves surface area close to embedded antennae devoid of shielding.

Another object is to provide an effective process of manufacture of an electromagnetic interference shielding layer.

Another object is to provide a process that can be adapted individually for each and every semiconductor package to be equipped with an electromagnetic interference shielding layer.

Another object is to provide a process of manufacture of an electromagnetic interference shielding layer having a complex design.

Another object is to provide a process which includes a rapid forming of an electromagnetic interference shielding layer on a semiconductor package.

Another object is to provide a process which avoids expensive techniques, e.g., those requiring a vacuum, for the manufacture of an electromagnetic interference shielding layer on a semiconductor package.

Another object is to provide a process which includes a step of fixating an electromagnetic interference shielding layer on a semiconductor package, while avoiding the heat of electronic components inside the semiconductor package.

A further object is to provide a process for applying an electromagnetic interference shielding layer or layers on a plurality of semiconductor packages prior to dicing of the semiconductor packages into individual semiconductor packages.

A further object is to provide a process for applying an electromagnetic interference shielding layer or layers on semiconductor packages after dicing into individual semiconductor packages.

Another object is to provide a process of manufacture of an electromagnetic interference shielding layer, which requires less steps than processes known in the art.

Another object is to provide a process of manufacture of an electromagnetic interference shielding layer which can be individually different for each and every object to be shielded by such a process.

Another object is to provide a process of manufacture of an electromagnetic interference shielded layer wherein the shielding layer can be altered within the production cycle.

Another object is to provide a process of manufacture of an electromagnetic interference shielding layer which provides high flexibility with regard to the layer of the shielding layer during operation of the process.

Another object is to provide a process of manufacture of an electromagnetic interference shielding layer which provides individual marking for identifying individual semiconductor packages.

Another object is to provide very thin but effective electromagnetic interference shielding layers on semiconductor packages and processes of manufacture of such layers.

Another object is to provide semiconductor packages with a covering electromagnetic interference shielding feature which is indifferent regarding mechanical stress.

Another object is to provide an electromagnetic interference shielding layer on a semiconductor package where the electromagnetic interference shielding layer does not detach from a semiconductor package upon a mechanical or thermal influence thereon.

Another object is to provide a method of manufacturing electromagnetic interference shielding layers, which can be used for manufacturing electromagnetic interference shielded and stacked semiconductor packages.

Another object is to provide an electromagnetic interference shielded semiconductor package which has a smaller form factor than conventional frame-and-shield constructions.

Despite all efforts in the past, it remains an object to provide semiconductor packages which have an effective, thin, smooth and reliable shielding against electromagnetic interference. It remains a challenge to provide such shielding as a conformal layer attached directly to the encapsulation of a semiconductor package. Moreover, improvements are sought regarding methods of manufacturing conformal, electromagnetic interference shielding layers on semiconductor packages.

A contribution to the solution of at least one of the above objects is provided by the subject matter of the category-forming embodiments disclosed below. The dependent sub-embodiments of the category-forming embodiments represent preferred embodiments of the invention, the subject matter of which also makes a contribution to solving at least one of the objects mentioned above.

SUMMARY OF THE DISCLOSURE

To achieve these and other objects, and in view of its purposes, the present disclosure provides a method of manufacturing a semiconductor package, a semiconductor package, an article and use of an ink composition as summarized below in thirty-four enumerated embodiments.

|1| A method of manufacturing a semiconductor package, which is at least in part covered by an electromagnetic interference shielding layer, comprising at least these steps:
  i. providing the semiconductor package and an ink composition;
    wherein the ink composition comprises at least these constituents:
      a) A compound comprising at least one metal precursor; or a combination of two or more thereof;
      b) At least one organic compound, which is a liquid at room temperature and ambient pressure; which is preferably a volatile organic compound;
  ii. applying at least a part of the ink composition onto the semiconductor package, preferably by using inkjet technology, wherein a precursor layer is formed; and
  iii. treating the precursor layer with an irradiation, wherein at least 80%, for example at least 90%, of the irradiation has a wavelength in the range from 100 nm to 1 mm, or from 100 nm to 7 μm, or from 280 nm to 100 μm, from 800 nm to 10 μm, from 1 to 10 μm, or from 1 to 8 μm, or from 1 to 5 μm, based on the total irradiation applied during the treating.
  The electromagnetic interference shielding layer is formed on the semiconductor package; in an embodiment of embodiment |1|, the electromagnetic interference shielding layer adjoins the semiconductor package.

|2| The method of embodiment |1|, wherein the treating is performed by infrared irradiation, preferably having a peak wavelength in the range from 1,500 nm to 4,000 nm, e.g., around 3,000 nm, or in the range from 2,000 to 3,000 nm, or in the range from 2,800 to 3,300 nm.

|3| The method of embodiment |1| or |2|, wherein more than 80% of the irradiation applied to the precursor layer is irradiation at peak wavelengths in the range from 780 nm to 10 μm, the % based on the total radiative flux density of irradiation that is applied to the precursor layer during treatment step iii.

|4| The method of any one of the preceding embodiments, wherein the precursor layer is treated with the irradiation for less than 10 minutes, for example, less than 5 minutes, less than 2 minutes, less than 1 minute, less than 30 seconds, or less than 15 seconds.

|5| The method of any one of the preceding embodiments, wherein the total radiative flux density of the irradiation is in the range of from 100 to 1,000,000 W/m$^2$. It is determined by measuring the total electrical power consumption of the emitters, which produce the irradiation, and dividing by the illuminated area.

|6| The method of any one of the preceding embodiments, wherein the organic compound comprises at least a terpene, for example a terpene having in the range from 5 to 20, or from 5 to 12 carbon atoms, e.g., orange terpene, limonene, pinene or a combination of two or more terpenes, e.g., of two or more of those mentioned here.

|7| The method of any one of the preceding embodiments, wherein the semiconductor package comprises one or more electrical components, of which at least one is a semiconductor element, wherein the electrical components are at least in part molded with a mold.

|8| The method of any one of the preceding embodiments, wherein the electromagnetic interference shielding layer has a thickness of 5 μm or less, e.g., in the range from 5 nm to 5 μm, or from 50 nm to 2 μm, or from 100 nm to 1 μm.

|9| The method of any one of the preceding embodiments, wherein the thickness of the electromagnetic interference shielding layer varies at most 50%.

|10| The method of any of the preceding embodiments, wherein the metal precursor has a decomposition temperature in the range from 50 to 500° C., e.g., in the range from 80 to 350° C., or from 100 to 300° C., or from 130 to 270° C.

|11| The method of any one of the preceding embodiments, wherein the metal precursor is characterized by at least one of these features:
  a) at least a metal cation which is selected from the group consisting of silver, copper and gold, or a combination of any two of these, or all three;
  b) at least an anion which is selected from the group consisting of carboxylate, carbamate, formate and nitrate;
    or a combination of any two or more of the features according to a) and b).

|12| The method of any one of the preceding embodiments, wherein the ink composition further comprises at least one of these constituents:
  c) adhesion promoter;
  d) viscosity regulator;
  e) further additive(s);
  or a combination of any two, three or more thereof.

|13| The method of any one of the preceding embodiments, wherein the amount of metal in the ink composition is in the range from 1 wt. % to 60 wt. %, e.g., from 1 to 50 wt. %, based on the total weight of the ink composition, determined by thermogravimetric analysis (TGA).

|14| The method of any one of the preceding embodiments, wherein the ink composition comprises less than 10 wt. % of one or more metals selected from the group consisting of gold, rhodium, vanadium, palladium, platinum, osmium, tungsten, bismuth, silicon, zirconia, tin, copper and aluminum, the wt. % based on the total weight of the ink composition.

|15| The method of any one of the preceding embodiments, wherein the ratio of constituents a) and b) in the ink composition is in the range of from 4:1 to 1:5.

|16| The method of any one of the preceding embodiments, wherein the wt. % of the constituents a) and b) of the ink composition is in the range of 10 to 95 wt. %, based on the total weight of the ink composition.

|17| The method of any one of the preceding embodiments, wherein the amount of particles in the ink composition is less than 1 wt. %, based on the total weight of the ink composition.

|18| The method of any of the preceding embodiments, wherein the ink composition has a viscosity in the range of from 0.1 to 100 mPas, determined at a temperature of 20° C. and an environmental pressure of 1,013 hPa.

|19| The method of any of the preceding embodiments, wherein the electromagnetic interference shielding layer covers in the range of 40 to 95% of the semiconductor package's surface, based on the total surface of the semiconductor package.

|20| A semiconductor package comprising an electromagnetic interference shielding layer comprising at least one metal obtainable by a method according to any one of embodiments |1| to |19|,
wherein the electromagnetic interference shielding layer adjoins the semiconductor package;
wherein the metal is selected from the group consisting of silver, copper and gold; and
wherein the electromagnetic interference shielding layer is characterized by at least one of these features:
a/ a thickness in the range from 5 nm to 5 μm,
b/ a variation of the thickness of less than 50%,
c/ a specific conductance of at least 5% with respect to the specific conductance of the bulk metal, which constitutes the electromagnetic interference shielding layer, and
d/ a printing resolution in the range from 30 to 150 μm; or a combination of at least two of the features.

|21| A semiconductor package comprising at least an electronic component, a mold and a first layer of an electromagnetic interference shielding material,
wherein at least a part of the electronic component is molded with the mold,
wherein the first layer of the electromagnetic interference shielding material adjoins at least a part of the mold,
wherein the first layer of the electromagnetic interference shielding material is in direct physical contact with the mold,
wherein the specific conductance of the first layer of electromagnetic interference shielding material at least 5% of the bulk metal, e.g., in the range from 5 to 90% of the bulk material, and
wherein the thickness of the first layer of electromagnetic interference shielding material is in the range from 5 nm to 5 μm, e.g., from 50 nm to 2 μm, or from 100 nm to 1 μm, or from 250 to 750 μm.

|22| The semiconductor package of embodiment |20| or |21|, wherein the first layer has a sheet resistance of less than 20× the sheet resistance of bulk silver.

|23| The semiconductor package of any one of the embodiments |20| to |22|, wherein the first layer is a single layer of electromagnetic interference shielding material.

|24| The semiconductor package of any one of the embodiments |20| to |23|, wherein the electromagnetic interference shielding material comprises a metal selected from the group consisting of silver, gold and copper, or a combination of at least two thereof, or all three.

|25| The semiconductor package of any one of the embodiments |20| to |24|, wherein the electromagnetic interference shielding layer on the semiconductor package passes an adhesion test according to ASTM D3359 as specified herein after an aging treatment (85° C., 85% RH) according to JESD22-A101D for at least 250 hours, e.g., for at least 500 hours, or for at least 1,000 hours.

|26| The semiconductor package of any one of the embodiments |20| to |25|, wherein a cover layer superimposes the electromagnetic interference shielding layer.

|27| An article comprising at least two semiconductor packages as in any one of the embodiments |20| to |26|, or semiconductor packages obtainable by a method according to any one of the embodiments |1| to |19|, wherein at least two of the semiconductor packages are stacked.

|28| A use of an ink composition comprising at least one metal precursor and at least one organic compound for creating an improved conductive layer on a semiconductor package, wherein the conductive layer forms an electromagnetic interference shield which layer adjoins to the surface of the semiconductor package, wherein the ink composition is applied to the semiconductor package using inkjet technology, wherein the conductive layer is formed by treating the ink composition with irradiation of a peak wavelength in the range from 100 nm to 1 mm.

|29| The use of embodiment |28|, wherein the thickness of the electromagnetic interference shielding layer is in the range from 5 nm to 5 μm, e.g., from 50 nm to 2 μm, or from 100 nm to 1 μm, or from 250 to 750 μm.

|30| The use of embodiment |28| or |29|, wherein the specific conductance of the electromagnetic interference shielding layer is in the range from 5 to 90%, based on the specific conductance of the bulk metal which constitutes the electromagnetic interference shielding layer.

|31| The use of any one of the embodiments |28| to |30|, wherein the precursor layer is cured with the irradiation for less than 10 minutes, for example, less than 5 minutes, less than 2 minutes, less than 1 minute, less than 30 seconds, or less than 15 seconds.

|32| The use of any one of the embodiments |28| to |31|, wherein a semiconductor package according to a method of any one of embodiments |1| to |19|, or a semiconductor package according to any one of embodiments |20| to |26| is obtained, or a method of any one of embodiments |1| to |19| is used.

|33| A use of an ink composition comprising at least a metal precursor and at least one organic compound to produce an improved electromagnetic interference shield on a semiconductor package, wherein the improvement consists of at least one of these features:
A] a thinner yet effective electromagnetic interference shielding layer;
B] the electromagnetic interference shielding layer is less susceptible to mechanical stress or impact;
C] a better adhesion of the electromagnetic interference shielding layer to the semiconductor package;
or a combination of two or more of these features.

|34| The use of embodiment |33|, wherein a semiconductor package according to a method of any one of embodiments |1| to |19|, or a semiconductor package according to any one of embodiments |20| to |26| is obtained, or a method of any one of embodiments |1| to |19| is used.

It is to be understood that both the foregoing general description and the following detailed description are exemplary, but are not restrictive, of the disclosure.

BRIEF DESCRIPTION OF THE DRAWING

The disclosure is best understood from the following detailed description when read in connection with the accompanying drawing. There is no intention to limit the invention to the shapes and details as shown in the drawing. Included in the drawing are the following figures.

DETAILED DESCRIPTION

Figure 1:
FIG. 1 shows a flowchart of a process for making a layer.

The term "adjoins" with respect to the relation of a layer and an item is used in the present context to describe that the layer overlays the item and is entirely connected with the item's surface. "Entirely" means that merely small disconnected spots may remain due to defects of the application process or because of unwanted particles on the item. A layer which adjoins an article is often also referred to as an "conformal layer."

Room temperature equates 20° C. (+293K). The term "ambient pressure" stands for an absolute pressure of 1,013 hPa. Standard humidity in the present context is 50% RH if not indicated otherwise. The conductance of silver is $6.14*10^7$ A*m/V at 20° C.

A liquid in the present context describes a substance or a composition having more than one constituent which has a viscosity in the range from 1 to 300 mPas, determined according DIN 53019-1:2008 at 20° C. The viscosity is measured using a Brookfield DV3 rheometer, spindle Nr. 21, at 100 rpm and 20° C.

The term "volatile" refers to an organic chemical compound or composition which has a beginning boiling point of 250° C. at most at ambient pressure.

The term "radiative flux density" is the amount of power radiated on a given area, measured in $W/m^2$.

The printing resolution describes the detail a print holds. The value, determined in μm, describes the achievable feature sizes of adjacent printed and unprinted areas. As an example, it describes the smallest displacement of a print head to produce, after solidification of the jetted material, two distinct points by jetting two droplets to a substrate.

"Conductive" in the present context refers always to electric conductance. An article or a structure, e.g., a layer is electrically conductive when its bulk electrical conductance σ at 25° C. equals to or exceeds $1·10^6$ S/m. The bulk electrical conductance is determined using a four point probe system by Ossila, Sheffield, UK after measuring the median film thickness with a Dektak DXT-E profilometer.

A semiconductor package in the present context is an article which comprises one or more electrical components, of which at least one is a semiconductor element, wherein the electrical components are at least in part molded by a mold. A semiconductor package may or may not comprise a printed circuit board. In the present context, the term "semiconductor package" refers in particular to an article which comprises one or more electrical components, of which at least one is a semiconductor element, wherein the electrical components are at least in part molded by a mold and a substrate made of, e.g., epoxy comprising electrical leads.

The electromagnetic interference shielding layer is sometimes also referred to as a conductive layer, or an electromagnetic interference shielding layer.

A combination of two or more metals in the present context can be an alloy, an intermetallic phase or any other kind of conductive composition.

Ranges mentioned in the present context includes the values specified as limits. Thus, an indication of the type "in the range from X to Y" with respect to a size A means that A can assume the values X, Y and values between X and Y. One-sided limited ranges of the type "up to Y" for a size A include in an analogous manner the value of Y and those values smaller than Y.

A first aspect of the invention is a method of manufacturing a semiconductor package, which is at least in part covered by an electromagnetic interference shielding layer, comprising at least these steps:
  i. providing the semiconductor package and an ink composition, wherein the ink composition comprises at least these constituents:
     a) a compound comprising at least one metal precursor; or a combination of two or more thereof,
     b) at least one organic compound, which is a liquid at room temperature and ambient pressure, which is preferably a volatile organic compound;
  ii. applying at least a part of the ink composition onto the semiconductor package, preferably by using inkjet technology, wherein a precursor layer is formed; and
  iii. treating the precursor layer with an irradiation, wherein at least 80%, for example at least 90%, of the irradiation is in the range from 100 nm to 1 mm, or from 280 nm to 100 μm, from 800 nm to 10 μm, from 1 μm to 10 μm, or from 1 to 5 μm, based on the total irradiation applied during the treating, wherein the electromagnetic interference shielding layer is formed on the semiconductor package.

In some embodiments, the electromagnetic interference shielding layer is conformal with respect to the semiconductor package. Often, 100% of the total irradiation applied during the treatment step iii. is characterized by the wavelength ranges given above. Treating in this context is often also referred to as curing.

The ink composition can comprise further constituents, such as, e.g., adhesion promoter, viscosity aid, and/or organic solvent.

The amounts of all constituents of the ink composition sum always up to 100 wt. %.

The ink composition can be applied onto a semiconductor package using ink jet technology. Ink jet technology is a very cost efficient and rapid process to create precursor layers of the ink composition on the semiconductor package.

The mold embedding the circuitry of the semiconductor package can be of any type known in the art. It is usually a mold selected from the list consisting of phenol novolac, biphenyl, both with added spherical fused silica fillers, or composites thereof.

In some embodiments, the treating is performed by infrared irradiation, preferably having a peak wavelength in the range from 1,500 nm to 4,000 nm, e.g., around 3,000 nm, or in the range from 2,000 to 3,000 nm, or in the range from 2,800 to 3,300 nm.

In some embodiments, the precursor layer is treated with the irradiation for less than 10 minutes, for example, less than 5 minutes, less than 2 minutes, less than 1 minute, less than 30 seconds, or less than 15 seconds.

In some embodiments, the total radiative flux density of the irradiation is in the range of from 100 to 1,000,000 $W/m^2$. It is determined by measuring the total power electrical consumption of the emitters, which produce the irradiation, and dividing by the illuminated area.

In some embodiments, the organic compound comprises at least a terpene, for example a terpene having in the range from 5 to 20, or from 5 to 12 carbon atoms, or a combination of two or more terpenes.

A terpene in the present context is a naturally occurring unsaturated hydrocarbon that can be isolated from natural substances and whose structure can be traced back to one or more isoprene units. Today, some terpenes can also be obtained industrially and artificially. The polymers of cis- and trans-polyisoprene are usually not regarded as terpenes. The terpene is preferably an acyclic terpene or a cyclic terpene. Monocyclic terpenes are preferred among the cyclic terpenes.

According to a preferred design, the terpene is selected from the group consisting of orange terpene, limonene and pinene or a combination thereof.

Orange terpene is a liquid mixture of terpenes having a boiling temperature in the range from 170 to 180° C. (p=1 bar), which is normally obtainable by cold pressing orange peels. Orange terpene contains more than 80% by weight, preferably more than 85% by weight and particularly preferably more than 90% by weight of (+)/(−)-limonene. Other components of orange terpene often include aldehydes such as octanal, decanal, sinensal and octyl acetate and neryl acetate. A supplier of orange terpene (CAS No. 68647-72-3) is Carl Roth GmbH, 76231 Karlsruhe, Germany.

A pinene in the present context is a monoterpene hydrocarbon with the molecular formula $C_{10}H_{16}$. A particularly preferred pinene is β-Pinene (CAS no. 19902-08-0).

Limonene in the present context contains (r)-(+)-limonene, (s)-(−)-limonene, as well as a mixture of the two in any ratio, for example as a racemic mixture.

In some embodiments, the semiconductor package comprises one or more electrical components, of which at least one is a semiconductor element, wherein the electrical components are at least in part molded with a mold.

In some embodiments, the electromagnetic interference shielding layer has a thickness of 5 µm at most, for example in the range from 5 nm to 5 µm, or from 50 nm to 2 µm, or from 100 nm to 1 µm.

In some embodiments, the thickness of the electromagnetic interference shielding layer varies by 50% at most.

In some embodiments, the metal precursor has a decomposition temperature in the range from 50 to 500° C., e.g., in the range from 80 to 500° C., or in the range from 150 to 500° C., or from 180 to 350° C., or from 150 to 300° C., or from 180 to 270° C.

In some embodiments, the metal precursor is characterized by at least one of these features:
a) at least a metal cation which is selected from the group consisting of silver, copper and gold, or a combination of any two of them, or all three; and
b) at least an anion which is selected from the group consisting of carboxylate, carbamate, formate and nitrate;
or a combination of two or more elements with any two or more of the features according to a) and b).

In some embodiments, a combination of two or more metal precursors of the same metal cation but two or more different anions of the same or a different type can be used. For example, this includes a combination of a silver carboxylate and a copper salt, a combination of two different silver carboxylates as well as a combination of a silver carboxylate and a silver carbamate, and the like.

A carboxylate in this context is a salt carboxylic acid, which is composed of one or more metal cations and one or more carboxylate anions. The carboxylic acid part of the carboxylic acid anion can be linear or branched, or have cyclic structural elements, or be saturated or unsaturated. Mono- and dicarboxylates, cyclic carboxylates and ketocarboxylates are further preferred types of carboxylates. The carboxylate is usually a solid at room temperature. If the composition according to the invention is liquid or a mixture with solid and liquid components, at least part of the silver carboxylate may have changed to a completely dissolved form. A liquid composition in this context may comprise one or more liquid organic compounds.

In an embodiment, linear, saturated carboxylates are preferred, for example carboxylates having 1 to 20 carbon atoms, or having 7 to 16 carbon atoms, which always includes the carbon atom of the carboxylate group. Such linear carboxylates can be selected from the group consisting of acetate, propionate, butanoate, pentanoate, hexanoate, heptanoate, octanoate, nonanoate, decanoate, undecanoate, dodecanoate, tetradecanoate, hexadecanoate, and octadecanoate. In another embodiment, saturated iso-carboxylates and saturated neo-carboxylates having 1 to 20 carbon atoms, or having 7 to 16 carbon atoms, can be used. Neo-carboxylates with 5 or more carbon atoms are preferred in some embodiments, such as neopentanoate, neohexanoate, neoheptanoate, neooctanoate, neononanoate, neodecanoate and neododecanoate. The corresponding neocarboxylic acids are produced, for example, by Shell or Exxon.

In some embodiments, silver is the preferred metal cation and a preferred group of carboxylates are silver carboxylates. Of these, linear, saturated carboxylates are preferred, for example carboxylates having 1 to 20 carbon atoms, or having 7 to 16 carbon atoms, which always includes the carbon atom of the carboxylate group. Such linear carboxylates can be selected from the group consisting of silver acetate, silver propionate, silver butanoate, silver pentanoate, silver hexanoate, silver heptanoate, silver octanoate, silver nonanoate, silver decanoate, silver undecanoate, silver dodecanoate, silver tetradecanoate, silver hexadecanoate, and silver octadecanoate. In another embodiment, saturated silver iso-carboxylates and saturated silver neo-carboxylates having 1 to 20 carbon atoms, or having 7 to 16 carbon atoms, can be used. Silver neo-carboxylates with 5 or more carbon atoms are particularly preferred, such as silver neopentanoate, silver neohexanoate, silver neoheptanoate, silver neooctanoate, silver neononanoate, silver neodecanoate and silver neododecanoate.

A carbamate in this context is a salt of carbamic acid. A formate in this context is a salt of formic acid, e.g., silver and copper formiate. In some embodiments, a nitrate can be the metal precursor, e.g., silver nitrate and copper nitrate.

In some embodiments the ink composition may optionally contain one or more further components, for example selected from the group consisting of adhesion promoter, viscosity aid, organic solvent such as glycol ether, and additives. The sum of all constituents of the ink composition always equals 100% by weight.

In some embodiments, the amount of metal in the ink composition is in the range from 1 to 60 wt. %, e.g., from 1 to 50 wt. %, or from 10 to 30 wt. %, or from 30 to 50 wt. %, based on the total weight of the ink composition, always determined by thermogravimetric analysis (TGA).

In some embodiments, at least 80 wt. %, e.g., at least 90 wt. % or at least 95 wt. %, up to 99 or 100 wt. %, of the ink composition comprises one or more constituents selected from the group consisting of a silver carboxylate and a terpene, or a combination thereof.

In some embodiments, the ink composition has a weight ratio of silver to the sum of the elements gold, rhodium, vanadium, palladium, platinum, osmium, copper, tungsten, bismuth, silicon, zirconia, tin, copper and aluminum greater than 100:1, preferably greater than 150:1, relative to the weight proportions in the ink composition.

In further embodiments, the ink composition has a silver to rhodium weight ratio of more than 100:1, preferably more than 150:1, relative to the weight proportions in the ink composition.

In some embodiments, the total weight percentage of constituents of the ink composition containing one or more of the elements selected from the group consisting of gold, rhodium, vanadium, palladium, platinum, osmium, tungsten, bismuth, silicon, zirconia, tin, copper and aluminum is less than 10% by weight, preferably less than 8% by weight or 6% by weight, more preferably less than 5% by weight and most preferably less than 2% by weight or less than 1% by weight, the percentages by weight being always based on the total weight of the ink composition.

In another embodiment, the total weight percentage of constituents of the ink composition comprising one or more of the elements selected from the group consisting of rhodium, vanadium and osmium is less than 1 wt. %, preferably less than 0.5 wt. % or less than 0.2 wt. %, the wt. % based on the total weight of the composition.

In some embodiments, the weight ratio of constituent a), silver carboxylate, to constituent b), terpene, in the ink composition is in a range from 4:1 to 1:5, e.g., 1:2 to 2:1, or 1:1 to 1:2, or from about 1:1.5 to about 1:2. Preferably, in the case of component a), silver carboxylate, and in the case of component b), terpene, the weight ratio in the ink composition is in the range from about 1:1.5 to about 1:2. The indication "about" means that within the scope of the indicated accuracy an expert reads all commercially rounded values to the number. In the case of about 1:2, for example, this means a range from 1:1.5 to 2:4.9 inclusive, based on the weight of silver carboxylate and terpene. Such values can be determined from a liquid composition, for example from an HPLC measurement, whereby a characteristic signal is selected for each component and put into proportion.

In some embodiments, the sum of the proportions by weight of constituents a), silver carboxylate, and b), terpene, is in the range of 10 to 95 wt. %, or from 10 to 80 wt. %, based on the total weight of the ink composition. Furthermore, the sum of the weight proportions of constituents a) and b) in a range from 35 to 95 wt. %, or from 35 to 80 wt. %, or from 40 to 60 wt. %, most preferably from 45 to 55 wt. %, is preferably the sum of the weight proportions of constituents a) and b) in a range from 35 to 95 wt. %, or from 40 to 60 wt. %, most preferably from 45 to 55 wt. %, the wt. % being in each case based on the total weight of the composition.

In some further embodiments, the proportion by weight of constituent a), silver carboxylate, is in the range from 10 to 80% by weight, preferably from 10 to 60% by weight, or from 15 to 45% by weight, the percentage by weight being based on the total weight of the ink composition.

In a further embodiment, the ink composition may contain at least one, two, three or more carboxylic acids as further constituents. Carboxylic acid can in principle be any carboxylic acid that is known to those persons of ordinary skill in the art and appears suitable, in particular one or more tertiary carboxylic acids with 5 or more carbon atoms. One or a combination of several of the following elements may be selected as a tertiary carboxylic acid: neopentanoic acid, neohexanoic acid, neoheptanoic acid, neooctanoic acid, neononanoic acid, neodecanoic acid and neododecanoic acid. Neodecanoic acid, or a combination of neodecanoic acid with one of the other neocarboxylic acids mentioned, is particularly preferred. Neocarboxylic acids are, for example, produced by Shell or Exxon. By adding a carboxylic acid or a combination of several carboxylic acids, the shelf life of the ink composition can be extended.

In some embodiments, the ink composition may comprise an amount of metal particles. Preferably, the content of metal particles in the ink composition is less than 1% by weight, or less than 0.5% by weight, or less than 0.2% by weight, based on the total weight of the ink composition. Consequently, the composition according to the invention contains practically no metal particles. Metal particles in this context are in any case solids.

In a further embodiment, the ink composition has a precious metal content which is in a range from 1 to 30 wt. %, based on the total weight of the ink composition. The term "precious metals" refers to the following substances in the context of this invention: gold, silver, mercury, palladium, platinum, rhodium, iridium, ruthenium, osmium, tungsten, bismuth, silicon, zirconia, tin, copper and aluminum.

In a further embodiment, a layer of the ink composition applied to an article in an amount of 5 µl/cm$^2$, then cured at a peak wavelength of 3 µm with a radiative flux density of 50,000 W/m$^2$, and then cooled to room temperature, has an electrical conductance of at least 30%, based on the specific conductance of bulk silver. The specific conductance of silver is 6.14*10$^7$ A*m/V at 20° C.

In some embodiments, the ink composition has a viscosity in the range of from 0.1 to 100 mPas, e.g., from 20 to 70 mPas, determined at a temperature 20° C. and an environmental pressure of 1,013 hPa.

In some embodiments, the electromagnetic interference shielding layer covers in the range of 40 to 95%, e.g., 50 to 90% or 60 to 95% of the semiconductor package's surface, based on the total surface of the semiconductor package.

In other embodiments, the ink composition has a proportion of organic solvent in a range from 0.1 to 80% by weight, preferably from 20 to 80 or from 20 to 50% by weight, the percentages by weight being in each case based on the total weight of the ink composition.

As an organic solvent, one or more solvents selected from the group of glycol ethers, one or more further terpenes, or a combination of two or more of these solvents may be used. This includes a combination of several glycol ethers, several terpenes, one or more glycol ethers with one or more terpenes.

Glycol ethers are organic substances which have at least one ethylene glycol unit or one diethylene glycol unit. Propylene glycol ether or dipropylene glycol ether are particularly preferred as glycol ethers. Commercially available examples are Dowanol PNP (propylene glycol n-propyl ether) and Dowanol PnB (propylene glycol n-butyl ether), Dowanol DPnB (dipropylene glycol n-butyl ether) and Dowanol DPnP (dipropylene glycol n-propyl ether).

In some embodiments, further terpenes like those mentioned as constituent b), or a terpene not mentioned, can be selected as a further terpene.

In some embodiments, the ink composition contains some adhesion promoter with a proportion in the range from 0.1 to 5% by weight based on the total weight of the ink composition. It can be a single adhesion promoter or a mixture of two or more adhesion promoters.

A group of suitable adhesion promoters are rhodium alkyl compounds. Rhodium alkyl compounds contain at least one alkyl radical. If a rhodium alkyl compound contains more than one alkyl radical, for example 2 or 3 alkyl radicals, these alkyl radicals may be identical or different. The at least one alkyl radical preferably has a length of 2 to 20 carbon atoms, particularly preferably a length of 12, 14, 16 or 18 carbon atoms. Rhodium nonanoate is a particularly preferred adhesion promoter.

In some embodiments, the ink composition contains one or more viscosity aids with a proportion in a range from 5 to 30 wt. %, more preferably in a range from 10 to 20 wt. %, the wt. % being based in each case on the total weight of the ink composition.

A colophony resin or derivatives thereof are suitable viscosity aids with regard to the ink composition. A particularly preferred commercial product is balsamic resin, available from H. Reynaud & Fils GmbH, Hamburg, Germany.

In some embodiments, the ink composition may contain further additives with a proportion in the range from 0.05 to 3 wt. %, more preferably in the range from 0.05 to 1 wt. %, the wt. % being based in each case on the total weight of the ink composition. All chemical substances and mixtures which are known to the person of ordinary skill in the art and appear suitable for the intended purpose may be considered as further additives. Silicone-containing additives, for example one or more containing polyether-modified polydimethylsiloxane, are particularly preferred as further additives. Such additives are, for example, available under the brand name BYK from BYK Additives & Instruments GmbH, 46483 Wesel, Germany.

The constituents to the ink composition can be mixed in all manner known to and considered suited by the person of ordinary skill in the art. The mixing may be conducted at slightly elevated temperatures to facilitate the mixing process. Usually, the temperature during mixing does not exceed 40° C. The ink composition can be stocked at room temperature, or in a refrigerator.

Another aspect of the invention is a semiconductor package comprising an electromagnetic interference shielding layer comprising at least one, preferably elemental, metal obtainable by a method according to the first aspect and its embodiments,
the metal selected from the group consisting of silver, copper and gold,
wherein the electromagnetic interference shielding layer covers the semiconductor package and is characterized by at least one of these features:
a/ a thickness in the range from 5 nm to 5 µm;
b/ a variation of the thickness of less than 50%, based on the thickness of the electromagnetic interference shielding layer;
c/ a specific conductance of at least 5%, for example at least 10%, or at least 20%, or at least 30%, or at least 50%, or in the range from 20 to 50%, or from 25 to 40%, always with respect to the specific conductance of the bulk metal, which constitutes the electromagnetic interference shielding layer; the specific conductance can sometimes reach values of up to 100%, e.g., up to 90%, based on the specific conductance of the bulk metal, which metal constitutes the electromagnetic interference shielding layer; and
d/ a printing resolution in the range from 30 to 150 µm;
or a combination of at least two of the features.

In an embodiment, the electromagnetic interference shielding layer of the semiconductor package can be characterized by a combination of two or more of these features. Preferred combinations of these features are: a/b/, a/c/, a/d/, b/c, b/d and c/d.

Another aspect of the invention is a semiconductor package comprising at least an electronic component, a mold and a first layer of an electromagnetic interference shielding material,
wherein at least a part of the electronic component is molded with the mold;
wherein the first layer of the electromagnetic interference shielding material adjoins at least a part of the mold,
wherein the specific conductance of the first layer of electromagnetic interference shielding material is at least 5%, e.g., in the range from 5 to 90%, e.g., from 10 to 70%, or from 20 to 50%, each based on the specific conductance of the bulk metal, which metal constitutes the electromagnetic interference shielding layer; and
wherein the thickness of the first layer of electromagnetic interference shielding material is in the range from 5 nm to 5 µm, e.g., from 50 nm to 2 µm or from 100 nm to 1 µm.

When a layer becomes too thick it might not be producible as a single ink jetted layer anymore. Very thin layers can lack some electromagnetic interference shielding efficiency. However, thinner layers of electromagnetic interference shielding material are more tolerant to deformation because of a larger window of plastic deformation. This can reduce a tendency of the layer to delaminate, package warping and so on.

The semiconductor package of this aspect has the same embodiments and features as the semiconductor package described above and in the context of the first aspect of the invention.

In some embodiments, the first layer has a thickness in the range from 5 nm to 5 µm.

In some embodiments, the first layer has a sheet resistance of less than 20×, e.g., 5×, or 4×, or 3×, or 2× the sheet resistance of bulk silver.

In some embodiments, the first layer is a single layer of electromagnetic interference shielding material.

In some embodiments, the electromagnetic interference shielding material comprises a metal selected from the group consisting of silver, gold, copper, or a combination of at least two thereof.

In some embodiments, a cover layer can be superimposed on the electromagnetic interference shielding layer. The cover layer can be positioned on the top, bottom and/or side of the semiconductor package, or a combination of the aforementioned surfaces in order to ensure electrical and/or environmental insulation to the article.

Another aspect of the invention is an article comprising at least two semiconductor packages as in the aspects above or obtainable by a method according to the first aspect, wherein at least two of the semiconductor packages are stacked. Each of the semiconductor packages comprises at least one electromagnetic interference shielding layer as described in one or more of the embodiments above. The electromagnetic interference shielding layer separates the semiconductor packages from each other, thus providing electromagnetic interference shielding between the semiconductor packages. A further cover layer can be positioned on the top, bottom and/or side of the article, or a combination thereof, in order to ensure electrical and/or environmental insulation to the article.

Another aspect of the invention is a use of an ink composition comprising at least one metal precursor for creating an improved conductive layer on a semiconductor package, wherein the conductive layer forms an electromagnetic interference shield which adjoins to the surface of the semiconductor package, wherein the ink composition is applied to the semiconductor package using inkjet technology, wherein the conductive layer is formed by treating the ink composition with irradiation of a peak wavelength in the range from 100 nm to 1 mm, in some embodiments for less than 10 minutes, for example, less than 5 minutes, less than 2 minutes, less than 1 minute, less than 30 seconds, or less than 15 seconds. Further embodiments of this aspect are those which are described above with regard to the first aspect.

In an embodiment, the thickness of the electromagnetic interference shielding layer is in the range from 5 nm to 5 μm, e.g., from 50 nm to 2 μm or from 100 nm to 1 μm or from 250 to 750 μm.

In another embodiment, the specific conductance of the electromagnetic interference shielding layer is in the range from 5 to 90%, based on the specific conductance of the bulk metal which constitutes the electromagnetic interference shielding layer.

In another embodiment, the precursor layer is cured with the irradiation for less than 10 minutes, for example, less than 5 minutes, less than 2 minutes, less than 1 minute, less than 30 seconds, or less than 15 seconds.

The semiconductor package and the method cited in this use have the same embodiments and features as the semiconductor package described above and the method described in the first aspect of the invention.

Another aspect of the invention is a use of an ink composition comprising at least a metal precursor and at least one organic compound to produce an improved electromagnetic interference shield on a semiconductor package, wherein the improvement consists of at least one of these features:

A] a thinner yet effective electromagnetic interference shielding layer;
B] the electromagnetic interference shielding layer is less susceptible to mechanical stress or impact;
C] a better adhesion of the electromagnetic interference shielding layer to the semiconductor package;
or a combination of two or more of these features.

The semiconductor package and the method cited in this use have the same embodiments and features as the semiconductor package described above and the method described in the first aspect of the invention.

Turning to the drawing, FIG. 1 shows a flowchart of a method for producing a layer. In step i., a semiconductor package and an ink composition are provided. In step ii., the ink composition is applied to the semiconductor package to give a pre-selected precursor layer using an inkjet printer. In step iii., the precursor layer is then treated with irradiation of a peak wavelength in the range from 100 nm to 1 mm. After 10 minutes, the electromagnetic interference shielding layer is formed from the precursor layer. The electromagnetic interference shielding layer is firm and adheres well to the semiconductor package.

Figure 2:
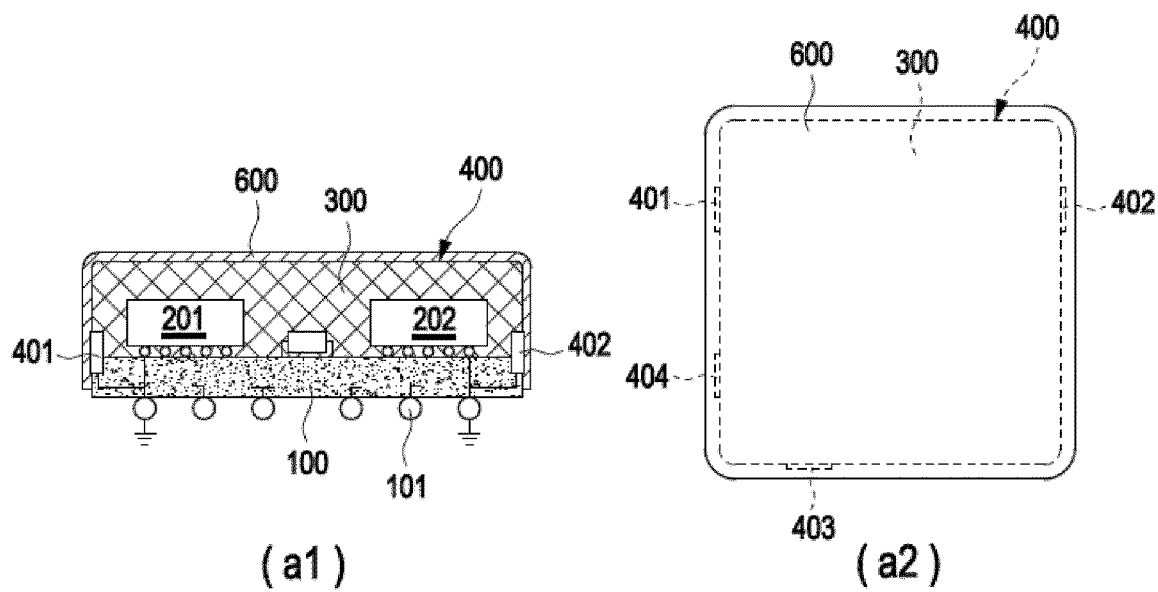
FIG. 2 shows a cross-sectional view (a1) and a top view (a2) of a semiconductor package which is covered by an electromagnetic interference shielding layer.

FIG. 2 shows a cross-sectional view (a1) of a semiconductor package 400 which is covered by an electromagnetic interference shielding layer 600. The electromagnetic interference shielding layer 600 is connected to the electrical ground of the semiconductor package 400 by contacts 401, 402. The semiconductor package 400 comprises a substrate 100, electronic parts 201, 202 and a mold 300, which fills gaps between the electronic parts 201, 202 of the semiconductor package 400 and acts as an insulating material as well. The semiconductor package 400 may comprise electrical pinthroughs and contacts 101 on the side of the substrate 100 facing away from the mold 300.

The top view (a2) of FIG. 2 shows the semiconductor package 400 and the contacts 401, 402 for electrical grounding of the covering electromagnetic interference shielding layer 600. Further contacts 403, 404 are provided for contacting the electromagnetic shielding layer to the electrical ground.

Figure 3:
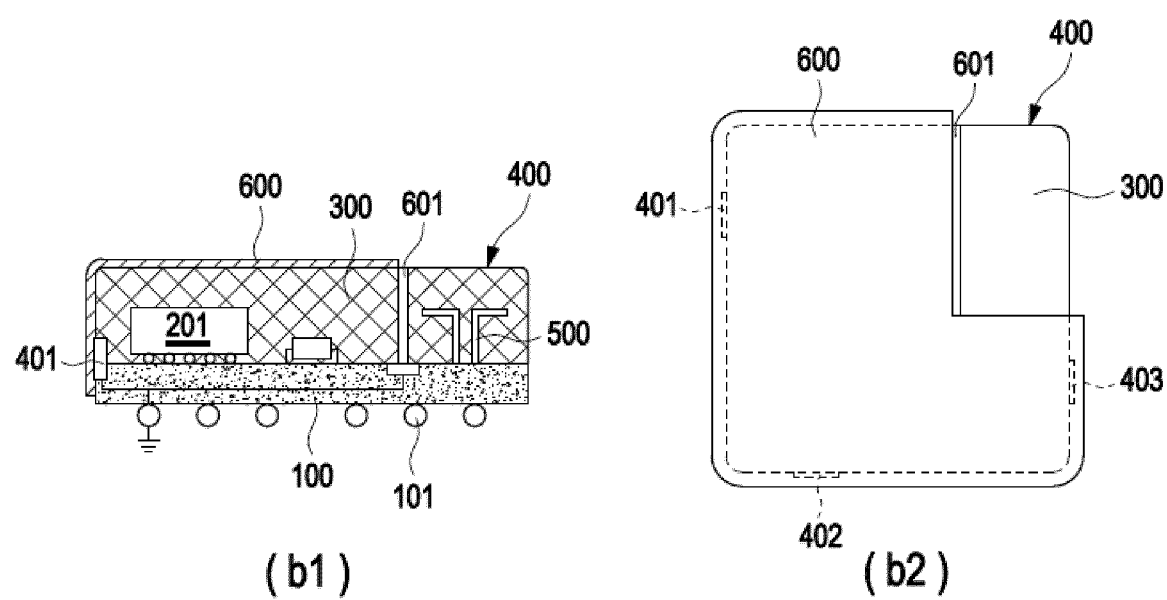
FIG. 3 shows a cross-sectional view (b1) and a top view (b2) of a semiconductor package which is partially covered by an electromagnetic interference shielding layer.

FIG. 3 shows a cross-sectional view (b1) of the semiconductor package 400 which is covered in part by the electromagnetic interference shielding layer 600. Besides further details which were shown in FIG. 2, the semiconductor package 400 in FIG. 3 (b1) has an internal shielding structure 601 and an antenna 500. The antenna 500 is covered by the mold 300 as are the electronic parts, e.g., the electronic parts 201. However, the antenna 500 is not encompassed by the electromagnetic interference shielding layer 600. The top view (b2) of FIG. 3 shows that the semiconductor package 400 is covered in part by the electromagnetic interference shielding layer 600. One part of the mold 300 of the semiconductor package 400 remains uncovered. There, the mold 300 appears and the antenna 500 is not shielded.

Test Methods a. Determination of Metal Contents

An inductively coupled plasma (ICP) was coupled with optical emission spectrometry (OES) for evaluation. Typical determination limits according to the method used here are 1 ppm (related to the weighed sample quantity). The determination of the element concentration with the measuring instrument was carried out according to the specifications of the instrument manufacturer (ICP-OES: VARIAN Vista MPX) and using certified reference liquids for calibration. The element concentration in the solution (100 ml) determined by the instrument was then converted to the original sample weight (0.1 g).

Note: The sample to be analyzed was dissolved with aqua regia (a mixture of 3 parts HCl, 37% by weight and 1 part $HNO_3$, 65% by weight) in a microwave reaction system MultiwavePro from Anton Paar.

The following elements can be determined in this way: Ag, Au, B, Bi, Ce, Co, Cr, Cu, Fe, In, Ir, Mn, Ni, Pd, Pt, Rh, Ru, Sb, Si, Sn, Ti, V, Zn, and Zr.

b. Intensity of Irradiation

The radiative flux density was determined by measuring the total power consumption of the emitters and dividing by the illuminated area.

c. Spectrum of Irradiation

The distribution of wavelengths of an irradiation applied during a treatment, % of irradiation (=area within two limiting wavelengths with respect to the total area under the spectrum curve and y=0) and peaks in the distribution were determined using a Thorlabs Optical Spectrum Analyzer OSA207C: 1.0-12.0 μm combined with a hollow core fiber, available from Opto-Knowledge Systems, Inc., Torrance (Calif.), USA, by bringing one end of this fiber close to the emitter surface. The wavelength distribution was determined using the FT-IR measurement principle.

d. Aging Test

The electromagnetic interference shielding layer was subjected to elevated temperature and humidity (85° C./85% RH), and the adhesion and electrical performance was tested at different time intervals. It is an accelerated test in accordance with JESD22-A101D of 07.2015. The electrical sheet resistance was evaluated after 250 and 500 hours, adhesion after 250 and 500 hours, using the cross-cut tape test according to ASTM D3359. It was aimed to meet result "5B" which means no area of the electromagnetic interference shielding layer was removed.

e. Thickness and Variation of Thickness of Electromagnetic Interference Shield Layer The thickness of the conductive layer on the semiconductor package was measured directly by SEM analysis or comparatively using a film printed under the same conditions on glass and measuring the depth of an intentional scratch of a doctor blade with a Dektak DXT-E profilometer. The variation of thickness was derived from the maximum and minimum values of the line scan from the profilometer. The specific conductance of the layer was calculated and evaluated against the bulk value of the metal. This is, for example, for silver is $6.3 \times 10^7$ S/m.

f. Sheet Resistance & Specific Conductance

For measuring the sheet resistance of the electromagnetic interference shielding layer, a Four-Point Probe from Ossila, Sheffield, UK was used. The two outer probes of a conductive feature of the layer apply a constant current and two inner probes located on the same feature and between the outer probes measure the voltage. The sheet resistance was deduced using the Ohmic law in units of $\Omega/\square$. To determine the average sheet resistance, the measurement was performed on 25 equally distributed spots of the electromagnetic interference shielding layer. In an air conditioned room with a temperature of 22±1° C., all equipment and materials were equilibrated before the measurement. To perform the measurement, the Four Point Probe was equipped with a 4-point measuring head with rounded tips in order to reliably contact the conductive layer. A maximum current of 100 mA was applied. The measurement was started. After measuring the 25 equally distributed spots on the electromagnetic interference shielding layer, the average sheet resistance was calculated in $\Omega/\square$.

The specific conductance of the electromagnetic interference shielding layer was also determined using the four-point probe of Ossila. The sheet resistance was measured in various orientations, and the specific conductance was calculated by the Ossila four point probe's software upon entering the median film thickness, as determined with the profilometer Dektak DXT-E (Bruker GmbH, Karlsruhe, Germany).

g. Adhesion

Adhesion of a layer of the electromagnetic interference shielding material on a semiconductor package was evaluated according to the ASTM D3359 standard cross-cut using Intertape 51596 for the subsequent tape test. Test results were classified according to the standard into 6 categories in consideration of the percent of area of the electromagnetic interference shielding layer removed from the surface of the semiconductor package, as follows:

| Classification | Percent area removed from substrate |
| --- | --- |
| 5B | 0% (none) |
| 4B | <5% |
| 3B | 5-15% |
| 2B | 15-35% |
| 1B | 35-65% |
| 0B | >65% |

EXAMPLES

The invention will now be described in conjunction with the following, non-limiting examples. The examples are included to more clearly demonstrate the overall nature of the disclosure. The examples are exemplary, not restrictive, of the disclosure.

Example 1

A semiconductor package surface consisting of a microcontroller, power amplifier and antenna which was encapsulated using silica-sphere filled epoxy novolac were cleaned using a plasma cleaner AP-600 of Nordson March, Concord (CA), USA, with 400 W plasma power for 90 seconds in an atmosphere of a reduced pressure of 90 mbars, the atmosphere containing 20 vol. % oxygen and 80 vol. % argon.

Next, the surfaces of the semiconductor package were printed using a Fuji Dimatix 2850 lab inkjet printer equipped with a 10 pl inkjet head filled with an ink consisting of 15 wt. % Ag neodecanoate and 85 wt. % limonene (DL-Limonene, CAS-No. 138-86-3, available from Merck KGaA under Catalog-ID no. 814546), based on the total weight of the ink composition. A printing resolution of 1016 DPI was chosen to achieve a median wet thickness of the printed ink of 20 μm.

The coated package was subsequently cured using a Heraeus Noblelight Carbon Infrared Twin Heater at a radiative flux density of 50,000 W/m$^2$ on a conveyor belt for 15 seconds and a silver layer was obtained. The radiative flux density was determined by measuring the total power consumption of the emitters, which produce the irradiation, and dividing by the illuminated area.

The median film thickness of the silver layer was comparatively measured after printing and curing with the same parameters on a glass substrate. The surface of the silver layer was scratched with a doctor blade and the resulting scratch depth was measured using a Bruker Dektak DXT-E profilometer.

The specific conductance of the electromagnetic interference shielding layer was measured using a four-point probe system by Ossila Ltd., Sheffield, UK, by measuring the sheet resistance in various orientations, and calculating the specific conductance by the system upon entering the median film thickness as determined by the profilometer.

The achieved adhesion of the electromagnetic interference shielding layer to the surface of the semiconductor package was evaluated using the ASTM D3359 standard cross-cut using Intertape 51596 for the subsequent tape test. The result showed a 5B behavior (no peeling) as described in the ASTM standard.

After an 85/85 humidity test the silver coated semiconductor package failed the adhesion test (cross-cut) after 500 hours.

Example 2

This example was carried out as Example 1 with these modifications: The ink composition was composed of 12 wt. % Ag neodecanoate (CAS No. 68683-18-1, available from ABCR GmbH, Karlsruhe, Germany) and 88 wt. % Dowanol PNP (Propylene Glycol n-Propyl Ether, CAS-No. 1569-01-3, available from The Dow Chemical Company, Inc., Midland (Mich.), USA). The radiative flux density was 100,000 W/m$^2$, applied for 10 seconds.

The silver coated semiconductor package was subsequently coated with a one-component resist coating composition using a Fuji Dimatix 2850 inkjet printer equipped with a 10 pl inkjet head with 1,270 dpi resolution. This semiconductor package was subsequently cured in an oven at 100° C. for 20 minutes.

An 85/85 humidity test was performed. This additionally encapsulated package passed the cross-cut test (measured up to 500 hours) with 5B behavior.

Example 3

A semiconductor package which was encapsulated in silica-sphere filled epoxy was cleaned using a plasma cleaner AP-600 of Nordson March, Concord (CA), USA, with 400 W plasma power for 90 seconds in an atmosphere of a reduced pressure of 90 mbars, the atmosphere containing 20 vol. % oxygen and 80 vol. % argon.

Next, the surfaces of the semiconductor package were printed using a custom-made lab inkjet printer equipped with a 21 pl inkjet head filled with an ink consisting of 18.2 wt. % Ag neodecanoate and 81.8 wt. % limonene, based on the total weight of the ink composition. A printing resolution of 1,200×600 DPI was chosen.

The coated package was subsequently cured using a Heraeus Noblelight Semray Typ 4003 (UV LED light source, 405 nm) for 315 seconds and a silver layer of 2 μm with a conductivity of 9 mΩ/□ was obtained. The median film thickness of the silver layer was measured by SEM analysis.

Although illustrated and described above with reference to certain specific embodiments and examples, the present disclosure is nevertheless not intended to be limited to the details shown. Rather, various modifications may be made in the details within the scope and range of equivalents of the claims and without departing from the spirit of the disclosure. It is expressly intended, for example, that all ranges broadly recited in this document include within their scope all narrower ranges which fall within the broader ranges.

The invention claimed is:

1. A method of manufacturing a semiconductor package, which is at least in part covered by an electromagnetic interference shielding layer, comprising at least these steps:
   i. providing the semiconductor package and an ink composition,
   wherein the ink composition comprises at least these constituents:
      a) a compound comprising at least one metal precursor, and
      b) at least one organic compound;
   ii. applying at least a part of the ink composition onto the semiconductor package, wherein a precursor layer is formed; and
   iii. treating the precursor layer with an irradiation, wherein at least 80% of the irradiation has a wavelength in the range from 100 nm to 1 mm, based on the total irradiation applied during the treating.

2. The method of claim 1, wherein the application of the ink composition in step ii. is performed by using inkjet technology.

3. The method of claim 1, wherein the treating is performed by infrared irradiation having a peak wavelength in the range from 1,500 nm to 4,000 nm.

4. The method of claim 1, wherein the precursor layer is treated with the irradiation for less than 10 minutes.

5. The method of claim 1, wherein the total radiative flux density of the irradiation is in the range of from 100 to 1,000,000 W/cm².

6. The method of claim 1, wherein the at least one organic compound is a terpene.

7. The method of claim 1, wherein the semiconductor package comprises one or more electrical components, of which at least one is a semiconductor element, wherein the electrical components are at least in part molded with a mold.

8. The method of claim 1, wherein the electromagnetic interference shielding layer has a thickness of 5 μm at most.

9. The method of claim 1, wherein the at least one metal precursor has a decomposition temperature in the range from 80 to 500° C.

10. The method of claim 1, wherein the at least one metal precursor has at least one of these features:
    at least one metal cation which is selected from the group consisting of silver, copper and gold, or a combination of any two of them, or all three;
    at least one anion which is selected from the group consisting of carboxylate, carbamate, formate and nitrate;
    or a combination of any two or more of the at least one metal cation and the at least one anion.

11. The method of claim 1, wherein the amount of metal in the ink composition is in the range from 1 to 60 wt. %, based on the total weight of the composition.

12. The method of claim 1, wherein an amount of metal particles in the ink composition is less than 1 wt. %, based on the total weight of the ink composition.

13. A semiconductor package comprising an electromagnetic interference shielding layer comprising at least one metal obtained by the method according to claim 1, wherein the electromagnetic interference shielding layer adjoins the semiconductor package and has at least one of these features:
    a thickness in the range from 5 nm to 5 μm;
    a variation of the thickness of less than 50%;
    an electrical conductance of at least 5% with respect to the conductance of the bulk metal; and
    a printing resolution in the range from 30 to 150 μm;
    or a combination of at least two of the features.

14. A semiconductor package comprising at least one electronic component, a mold and a first layer of an electromagnetic interference shielding material, wherein:
    the mold surrounds at least a part of the at least one electronic component;
    the first layer of the electromagnetic interference shielding material adjoins at least a part of the mold;
    the first layer of the electromagnetic interference shielding material is in direct physical contact with the mold;
    the specific conductance of the first layer of the electromagnetic interference shielding material is in the range from 5 to 90% of the bulk metal; and
    the thickness of the first layer of the electromagnetic interference shielding material is in the range from 5 nm to 5 μm.

15. The semiconductor package of claim 14, wherein the first layer is a single layer of electromagnetic interference shielding material.

16. The semiconductor package of claim 14, wherein the electromagnetic interference shielding material comprises a metal selected from the group consisting of silver, gold and copper or a combination of at least two thereof.

17. An article comprising at least two semiconductor packages according to claim 14, wherein at least two of the semiconductor packages are stacked.

18. A use of an ink composition comprising at least one metal precursor and at least one organic compound for creating an improved conductive layer on a semiconductor package, wherein:

the conductive layer forms an electromagnetic interference shield which layer adjoins to the surface of the semiconductor package;

the ink composition is applied to the semiconductor package using inkjet technology; and the conductive layer is formed by treating the ink composition with irradiation of a peak wavelength in the range from 100 nm to 1 mm.

19. The use of an ink composition according to claim 18, wherein the improvement consists of at least one of these features:

A] a thinner yet effective electromagnetic interference shielding layer;

B] the electromagnetic interference shielding layer is less susceptible to mechanical stress or impact; and C] a better adhesion of the electromagnetic interference shielding layer to the semiconductor package.

20. An article comprising at least two semiconductor packages obtained by a method according to claim 1 wherein at least two of the semiconductor packages are stacked.

\* \* \* \* \*